United States Patent
Song et al.

(10) Patent No.: US 7,154,287 B2
(45) Date of Patent: Dec. 26, 2006

(54) METHOD AND APPARATUS FOR LIGHT-CONTROLLED CIRCUIT CHARACTERIZATION

(75) Inventors: Peilin Song, Lagrangeville, NY (US); Franco Stellari, Ho Ho Kus, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/044,943

(22) Filed: Jan. 27, 2005

(65) Prior Publication Data

US 2006/0164113 A1   Jul. 27, 2006

(51) Int. Cl.
*G01R 31/26* (2006.01)
*G01R 31/305* (2006.01)

(52) U.S. Cl. ............. 324/763; 324/751; 324/753
(58) Field of Classification Search ............. None
See application file for complete search history.

(56) References Cited

U.S. PATENT DOCUMENTS 5,781,017 A * 7/1998 Cole et al. ............. 324/751
5,872,360 A * 2/1999 Paniccia et al. ......... 250/341.4
5,940,545 A 8/1999 Kash et al.
6,172,512 B1 1/2001 Evans et al.
6,859,031 B1 * 2/2005 Pakdaman et al. ........ 324/233

OTHER PUBLICATIONS

T. Lundquist et al., "Characterize Gate-Level Transistor Performance with PICA," Semiconductor International, 4 pages, Jul. 2001.
J.C. Tsang et al., "Picosecond Imaging Circuit Analysis," IBM J. Res. Develop., vol. 44, No. 4, pp. 583-603, Jul. 2000.

* cited by examiner

*Primary Examiner*—Minh N. Tang
(74) *Attorney, Agent, or Firm*—Anne V. Dougherty; Ryan, Mason & Lewis, LLP

(57) ABSTRACT

Light-controlled circuit characterization techniques are disclosed. For example, a technique for testing an integrated circuit includes the following steps/operations. At least a portion of the integrated circuit is stimulated with a light source so as to affect one or more electrical characteristics associated with the integrated circuit. By way of example, the light source may be a laser. Optical emissions are captured from the portion of the integrated circuit stimulated by the light source and/or one or more portions of the integrated circuit associated with the stimulated portion. The optical emissions are associated with one or more switching operations of one or more components of the integrated circuit. At least a portion of the captured optical emissions are processed to provide information about the integrated circuit.

20 Claims, 6 Drawing Sheets

METHOD AND APPARATUS FOR LIGHT-CONTROLLED CIRCUIT CHARACTERIZATION

FIELD OF THE INVENTION

Principles of the present invention generally relate to circuit testing and, more particularly, to circuit testing employing light-controlled circuit characterization techniques.

BACKGROUND OF THE INVENTION

Picosecond Imaging Circuit Analysis (PICA) is a very large scale integrated (VLSI) chip testing and diagnostic technique developed by IBM Corporation (Armonk, N.Y.). The PICA technique captures weak, transient light pulses that are emitted by individual switching transistors. The technique can produce "movies of information" flowing through complex integrated circuit (IC) chips, such as microprocessors, memories, etc. The technique can be used to extract electrical waveforms inside the chip.

The PICA technique is described in detail in J. C. Tsang et al., "Picosecond Imaging Circuit Analysis," IBM Journal of Research and Development, vol. 44, no. 4, July 2000, the disclosure of which is incorporated by reference herein. The technique is also described in detail in U.S. Pat. Nos. 5,940,545 and 6,172,512, the disclosures of which are incorporated by reference herein.

In the PICA technique, the emitted light can be collected from the frontside or the backside of an IC chip, although the backside collection is more convenient for testing chips that employ "flip-chip" packaging methodologies. The use of PICA as a diagnostic and characterization tool is a well-developed technology that provides precise timing information about specific logic gates.

SUMMARY OF THE INVENTION

Principles of the present invention provide light-controlled circuit characterization techniques.

For example, in one aspect of the invention, a technique for testing an integrated circuit includes the following steps/operations. At least a portion of the integrated circuit is stimulated with a light source so as to affect one or more electrical characteristics associated with the integrated circuit. Optical emissions are captured from at least one of the portion of the integrated circuit stimulated by the light source and one or more portions of the integrated circuit associated with the stimulated portion. That is, by way of example, optical emissions may be captured from the stimulated portion of the integrated circuit and/or a circuit logic cone fed by the stimulated portion. The optical emissions are associated with one or more switching operations of one or more components of the integrated circuit. At least a portion of the captured optical emissions is processed to provide information about the integrated circuit.

The stimulating step/operation may be a synchronous stimulating step/operation wherein the stimulating step/operation is at least partially synchronized with the processing step/operation. In an asynchronous stimulating step/operation, the stimulating step is not at least partially synchronized with the processing step.

Further, a particular component of the integrated circuit may be stimulated with a light source so as to affect one or more electrical characteristics associated with the component. The technique may include causing a change to one or more electrical characteristics associated with a component of the integrated circuit. This may be done electro-optically (e.g., generating carriers to charge a node or create a current) or thermally.

Still further, the stimulating step/operation may include changing a wavelength, an amplitude, and/or a duration associated with the light source so as to change an effect on the one or more electrical characteristics associated with the integrated circuit. The delay between the optical stimulation pulse compared to the PICA trigger can also be changed.

Accordingly, it is to be appreciated that changes in optical emission (PICA waveforms) may be expected due to the effect of the laser stimulation of the circuit, e.g., variation in the delays, skew, switching time, as well as new commutation not present without laser stimulation or the absence of switching transitions during the laser stimulation.

In one preferred embodiment of the invention, the light source is a laser.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

It has been realized that the higher density of VLSI devices, imposed by the need of high speed circuit performance and the relatively short time-to-market, have driven the need to rapidly characterize and diagnose complex integrated circuit designs early in the product cycle. Concurrently, conventional characterization test tools and diagnostic techniques, already somewhat limited, are quickly becoming obsolete.

Principles of the present invention address this and other problems. More particularly, in an illustrative embodiment, principles of the invention address the problem of characterizing complex designs by changing the characteristics of a complementary metal oxide semiconductor (CMOS) device on the fly using laser beams in combination with the measuring capabilities of the above-mentioned Picosecond Imaging Circuit Analysis (PICA) system.

While illustrative embodiments will be described below in the context of the PICA system, it is to be understood that principles of the invention are not limited to use with the PICA system and thus are more generally applicable to use with any suitable circuit testing system.

Accordingly, in an illustrative embodiment, a laser source is used with the PICA system for stimulating a part of the circuit during a PICA acquisition. The laser can be synchronous or asynchronous with a test pattern/loop of the PICA system, depending on the application. Moreover, the laser can be focused to affect a specific device or be spread to cover a larger area of the circuit. The laser may be used to change one or more electrical characteristics of a component of an integrated circuit, such as a transistor, a gate, or a sub-circuit, while measurements are taken with the PICA system. The physical mechanism for altering the characteristics can be electro-optical (e.g., carrier generation) or thermal, depending on the laser wavelength.

The laser wavelength, power and duration of the stimulus may be changed to achieve different effects. Especially for synchronous measurements, the laser beam can be pulsed with different durations and amplitudes. The effects on the circuit can be characterized with different acquisitions.

Such a circuit testing tool and methodology of characterizing devices is advantageously accomplished without the need to measure the chip response through chip input/output (I/O) pins. Thus, the PICA system provides a way of testing the chip with light emission in a manner that is non-invasive. It can also, advantageously, change the characteristics of a device on the fly.

In general, the PICA technique, which is based on the collection of near-infrared (NIR) light emitted by hot-carriers in the transistor channel during switching transitions of an individual gate, has been shown to be an invaluable method for detecting timing-related faults in backside packaged VLSI circuits. It has been extensively utilized for the evaluation of propagation delays, clock skews, pulse widths and slopes.

Figure 1:
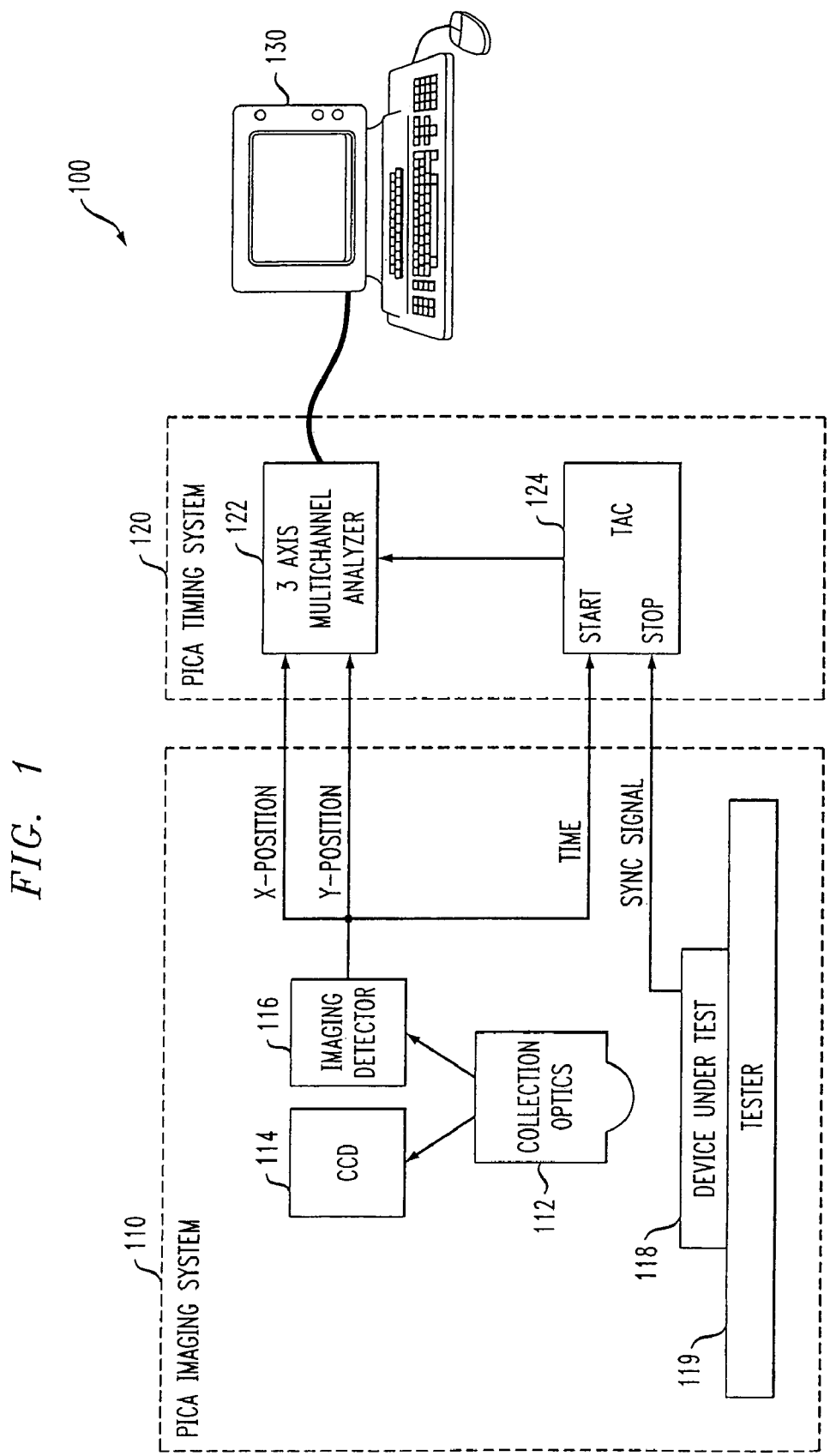
FIG. 1 is a diagram illustrating a circuit testing system with which principles of the invention may be employed.

Referring initially to FIG. 1, a diagram illustrates a circuit testing system with which principles of the invention may be employed. More particularly, FIG. 1 illustrates a PICA system.

Since operations of a PICA system as shown in FIG. 1 are well-known, only a summary description of the operations will be given here. For further details, the above-incorporated PICA literature can be referenced.

As shown, PICA system 100 includes PICA imaging system 110 and PICA timing system 120. PICA imaging system 110 includes: (1) collection optics 112 wherein different sizes of lenses may be used; (2) a time integrated photodetector 114 such as a Charge Coupled Device (CCD); and (3) a time-resolved detector such as a Mepsicron Photo-Multiplier Tube (PMT) 116, which is an imaging detector. The time-resolved detector may also be a single pixel detector such as the Superconducting Single-Photon Detector (SSPD) or an Avalanche Photo Diode (APD) of different materials (e.g., InGaAs, Ge, Si, etc.).

The DUT 118 (e.g., a microprocessor chip) is stimulated through a tester 119 (e.g., test board) and the light emission is collected by the optical system 112 and focused onto the photodetector 114. The tester provides a test pattern/loop through the input pins of the DUT. The test pattern/loop serves to exercise one or more circuits of the DUT as desired. While CCD 114 captures the static optical emission of the DUT, PMT 116 measures timing information associated with the optical emissions. Then, timing and spatial (x-positions and y-positions of the captured photons) information from DUT 118 is sent to timing system 120, where 3-axis multi-channel analyzer 122 and Time-to-Amplitude Converter (TAC) 124 are used to analyze the arriving photons.

The detected photons are used to start an electronic timer and sync signals are used to stop the timer. Outputs from the imaging detector are fed to a position analyzer 122 which generates voltage signals proportional to the x and y coordinates of the detected photon on the photocathode. Digital signals representing the output of the TAC 124 and the coordinates of the detected photon are stored in the analyzer 122 for subsequent display and analysis of optical waveforms and time-resolved images on computer station 130.

In accordance with principles of the invention, a new testing system is formed by adding a laser source to a PICA system such as the one illustrated in FIG. 1. It is to be appreciated that the laser source provides an optical stimulus for the circuit (DUT) concurrently with a PICA measurement. Thus, while an input test pattern/loop may be provided on the input pins of the device under test (DUT), the response caused by the laser source stimulating the DUT need not be measured through the I/O pins but rather through the optical emissions.

Figure 2:
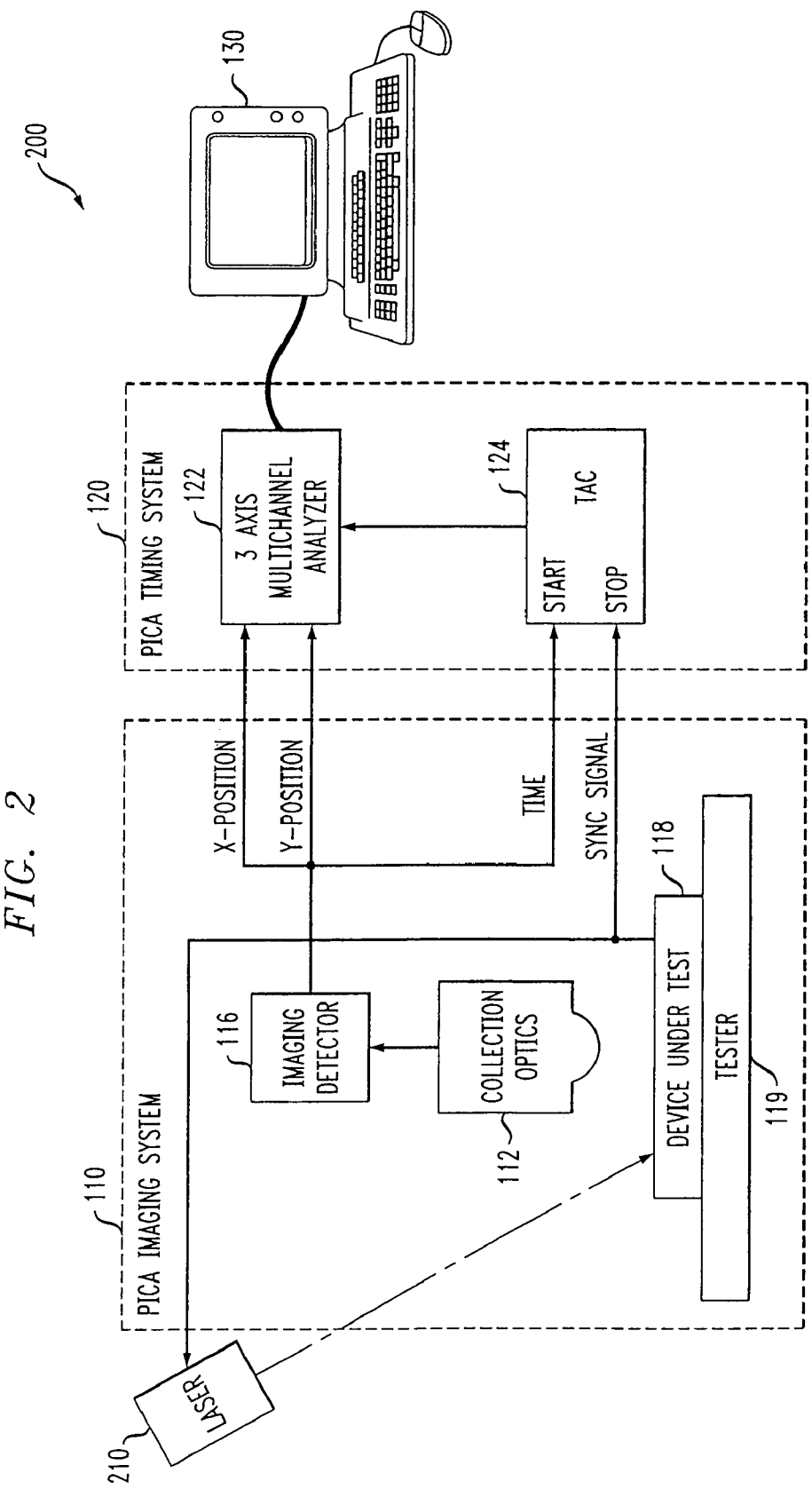
FIG. 2 is a diagram illustrating a circuit testing system, according to a first embodiment of the invention.

Referring now to FIG. 2, a diagram illustrates a circuit testing system 200, according to a first embodiment of the invention. It is to be understood that components having the same reference numerals as components in FIG. 1 have the same (or, at least, similar) functions as described above and, therefore, are not described again in detail.

More particularly, FIG. 2 depicts a testing system 200 with a laser source 210 synchronized with the test loop (PICA loop or test pattern) of PICA timing system 120.

As is known, PICA acquisition needs a repeatable test pattern or loop provided by a tester (119). This is the nature of the PICA system. To be able to get the timing information of the chip (118), a trigger (sync) signal is provided to synchronize the test pattern/loop. Similarly, as shown in FIG. 2, laser source 210 is synchronized with the test pattern. That is, the laser can be turned on/off with the sync signal.

Accordingly, the operation of testing system 200 in FIG. 1 is similar to that of testing system 100 of FIG. 1 with the notable exception that the laser source in testing system 200 provides stimulus to the device under test so that the optical emissions (PICA waveforms) that would otherwise be generated by the device due to the PICA test pattern are controllably-affected by the laser stimulus. For example, changes in optical emission may be caused due to the effect of the laser stimulation of the circuit, e.g., variation in the delays, skew, switching time, as well as new commutation not present without laser stimulation or the absence of switching transitions during the laser stimulation. Thus, once the optical emissions reach PICA imaging system 110, it is to be understood that collection optics 112, CCD 114 (not shown), detector 116, analyzer 122, TAC 124, and computer station 130, all function in a manner similar to that described above. It is to be appreciated that system 200 includes a CCD 114 which is positioned the same and functions in the same capacity (i.e., capturing static emissions) as shown and described above in FIG. 1. However, for drawing simplicity, the CCD is not expressly shown in FIG. 2.

Figure 3:
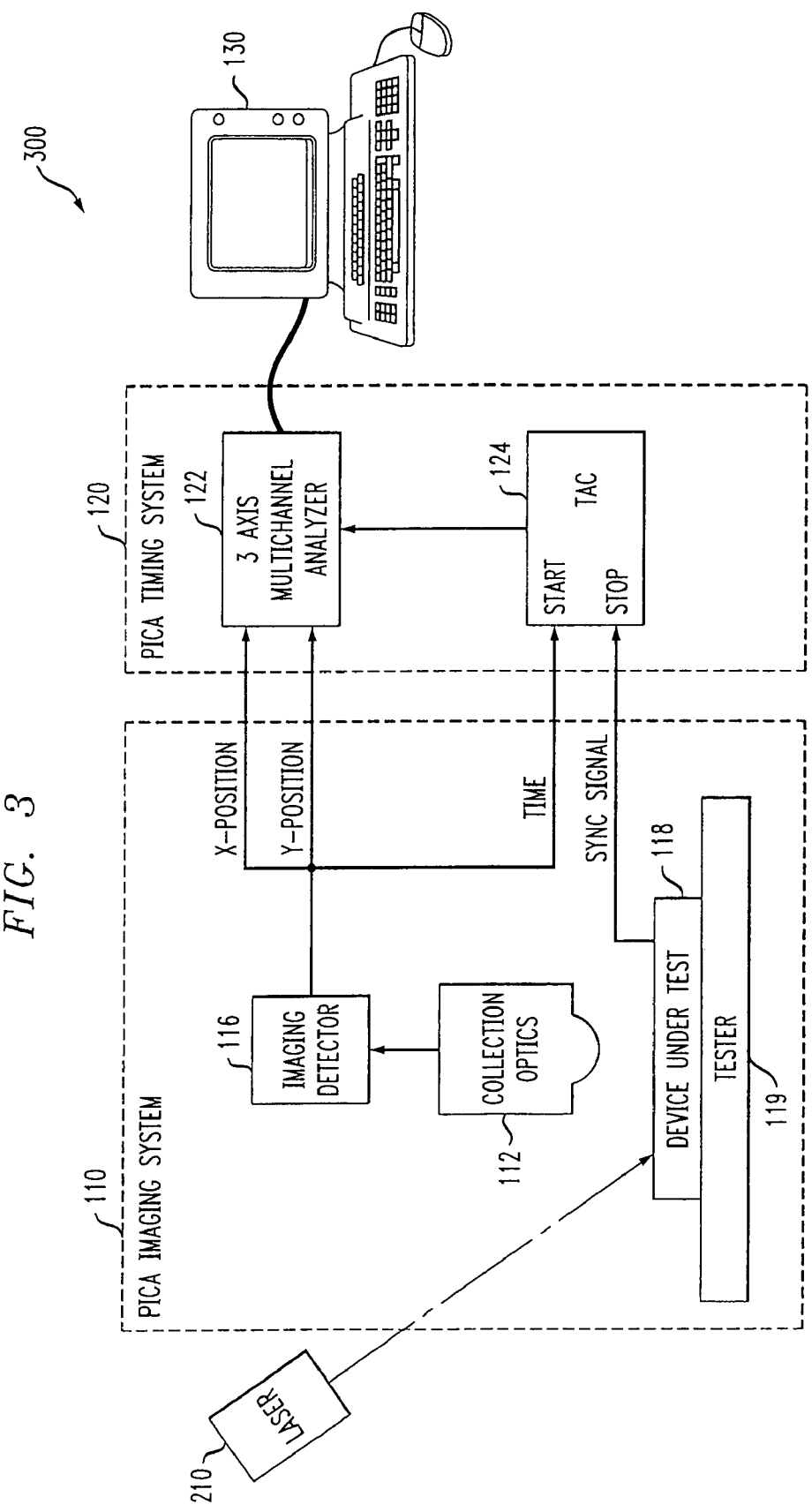
FIG. 3 is a diagram illustrating a circuit testing system, according to a second embodiment of the invention.

Referring now to FIG. 3, a diagram illustrates a circuit testing system 300, according to a second embodiment of the invention. It is to be understood that components having the same reference numerals as components in FIG. 2 have the same (or, at least, similar) functions as described above and, therefore, are not described again in detail.

More particularly, FIG. 3 depicts an alternative design of a testing system wherein a non-synchronized laser is used, i.e., that laser does not receive a sync signal. In the synchronous embodiment of FIG. 2, the laser is causing a transient modification of the circuit that may be detected by the PICA technique. In the asynchronous embodiment of FIG. 3, a continuous modification of the circuit behavior is achieved while the laser is active. That is, transient modification is an effect caused by a pulsed laser (i.e., laser is on for a short period of time) on a circuit, while the continuous modification is an effect caused by a laser that is continuously on. These two effects can have different impacts on the circuits being tested. For instance, continuous modification can cause the circuits to operate at a higher temperature which affects characteristics of the transistors in the circuit, e.g., the transistors may operate more slowly when heated.

Recently, single photon detectors have become popular given the continuous trend of the modern semiconductor industry towards smaller devices and lower supply voltages. This trend causes significant changes in the intensity and spectrum of the light emitted by present generation ICs. The total detectable light decreases exponentially with the electrical field in the transistor, and linearly with the lateral dimension of the field-effect-transistor (FET).

In particular, the progressive shift of the spectral distribution of the emitted light towards longer wavelengths makes the use of the existing PICA technique based on the use of a Mepsicron PMT more challenging, due to its lack of sensitivity in the NIR region of the spectrum. In recent years, a significant amount of effort has been devoted to the development of innovative detectors. Two that demonstrated significantly better quantum efficiency (QE) in the NIR region of the spectrum are the Superconducting Single Photon Detector (SSPD) and the InGaAs Avalanche Photo-Diode (APD).

Figure 4:
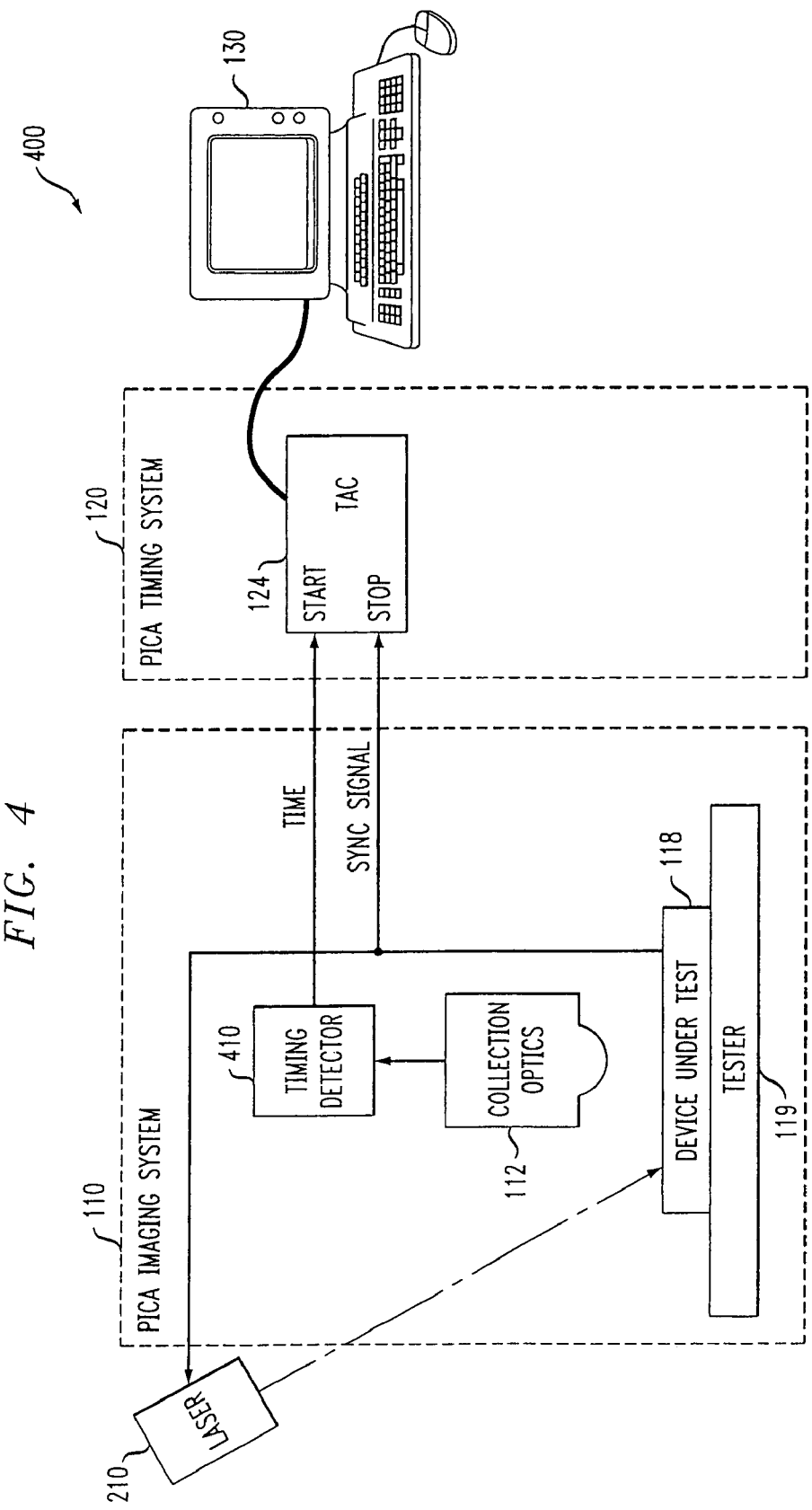
FIG. 4 is a diagram illustrating a circuit testing system, according to a third embodiment of the invention.
Figure 5:
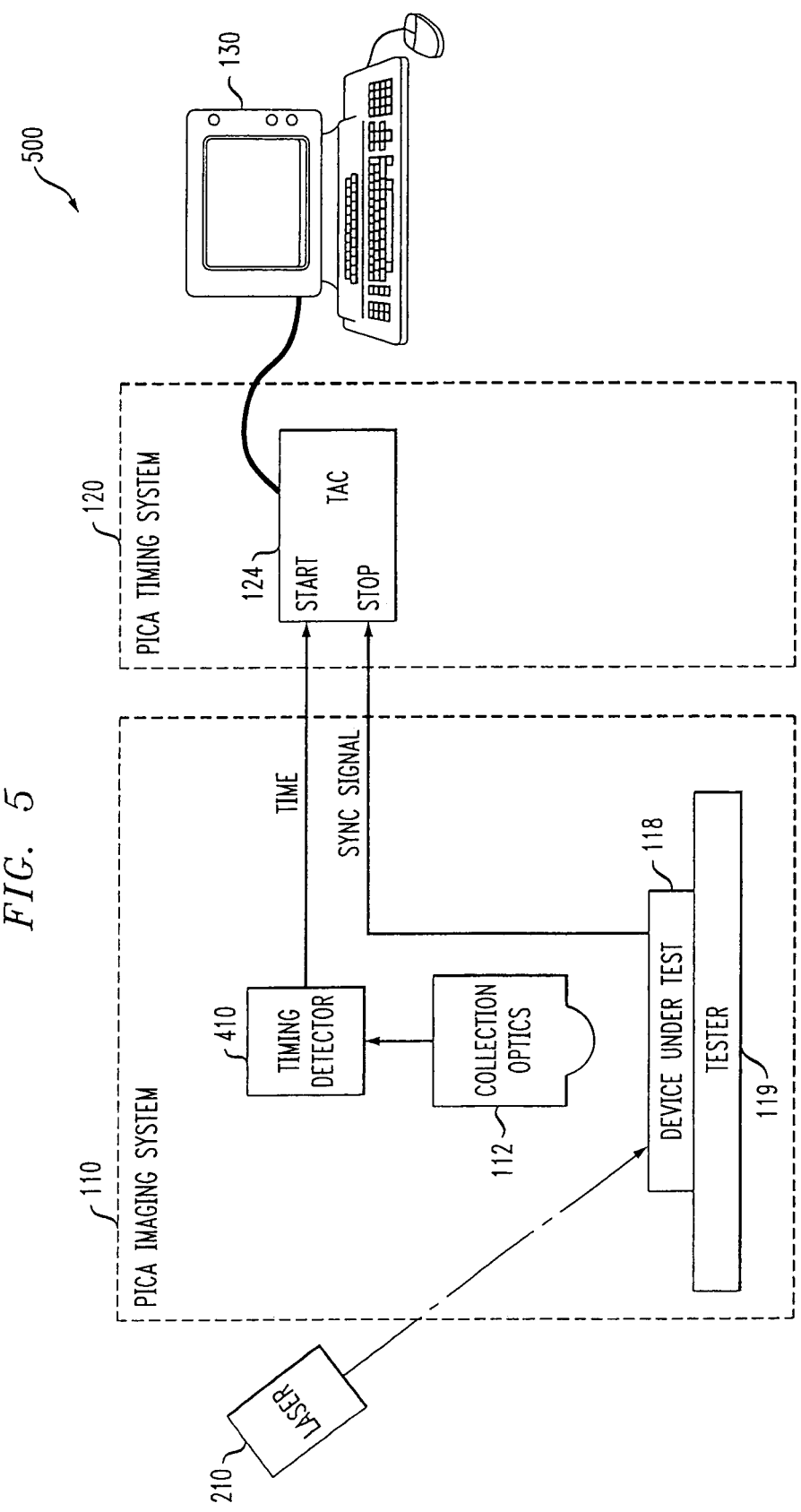
FIG. 5 is a diagram illustrating a circuit testing system, according to a fourth embodiment of the invention.

Testing systems, according to principles of the invention, based on a single photon detector are shown in FIGS. 4 and 5. FIG. 4 shows a synchronized laser embodiment and FIG. 5 shows a non-synchronized laser embodiment. It is to be understood that components having the same reference numerals as components in FIG. 2 have the same (or, at least, similar) functions as described above and, therefore, are not described again in detail.

It is to be further understood that the imaging detectors shown in FIGS. 1–3 have imaging capability, e.g., they have more than one pixel on the detector, itself, e.g., an imaging camera. But these types of detector may not be sufficiently effective for the latest chip applications. Thus, a single pixel detector (such as a Superconducting Single Photon Detector or SSPD), also called a timing detector (410 in FIGS. 4 and 5), may be employed instead. Since detector 410 is a single pixel detector, it does not have output x, y information. Therefore, no analyzer (122) is needed.

Figure 6:
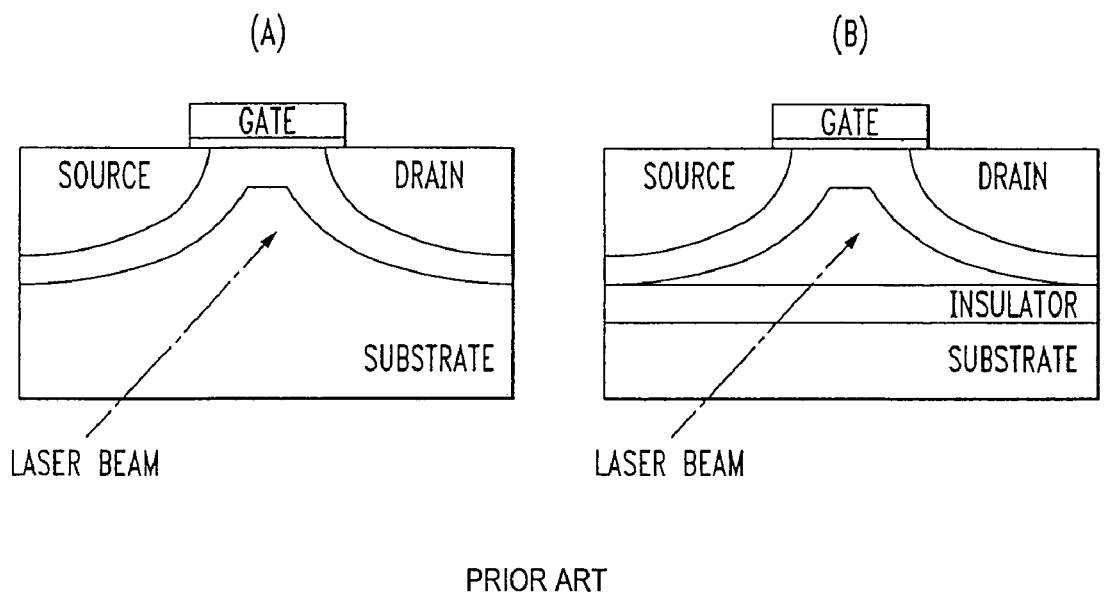
FIGS. 6A and 6B are diagrams respectively illustrating a cross-section view of a bulk field-effect-transistor and a silicon-on-isolator field effect transistor.

Referring now to FIGS. 6A and 6B, diagrams respectively illustrate a cross-section view of a bulk FET and a silicon-on-isolator (SOI) FET. When a FET is exposed to a laser beam, light energy of the laser penetrates through the bottom surface of silicon substrate and causes different effects such as an increase in the electron-hole pair generation or a change in the device temperature, depending upon the laser wavelength. As a consequence, one can achieve a modification of the electrical behavior of the transistor/gate: a change of threshold, a change of build-in potential, a variation of the body potential, a variation of the extension of the charge region, a change in the semiconductor bandgap, etc.

While the type of laser (and its operating characteristics) used to implement principles of the invention is dependent on the particular testing application being performed, some illustrative laser and operating characteristics will be given below. However, it is to be understood that the invention is not limited to such examples.

To reduce a FET's threshold (VT), a solid-state laser such as a Neodymium: Yttrium-Aluminum-Garnet (Nd:YAG) laser operating at a wavelength of 1064 nanometer (nm) can be used. Such a laser generates excess hole-electron pairs. FETs exposed to the laser switch faster electrically. Typical laser powers that may be employed are on the order of 100 milliwatts (mW). It is to be appreciated that the laser may simply be directed at the component being stimulated, e.g., FET.

Similarly, to generate a thermal effect on a FET, a 1300 nm wavelength laser can be used. Such a laser generates a localized heat region that slows down the FET speed.

Of course, those ordinarily skilled in the art will realize other laser types and operating characteristics that may be employed in order to achieve a desired circuit characteristic effect measurable by the captured optical emissions.

Figure 7:
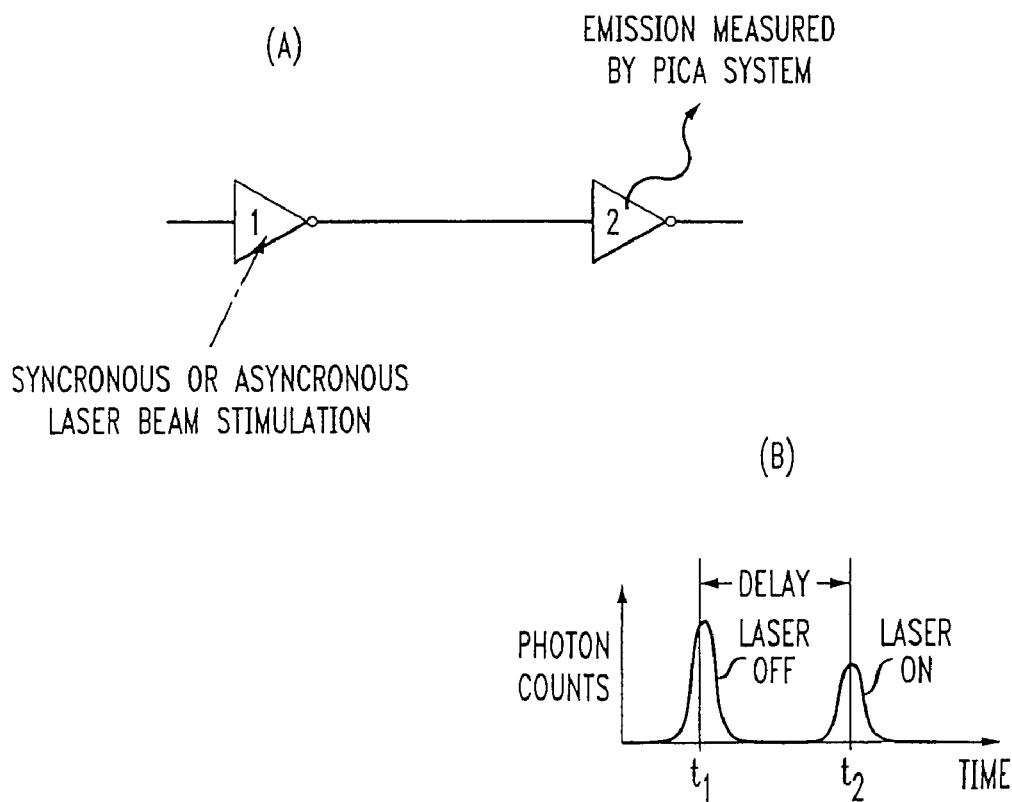
FIGS. 7A and 7B are diagrams illustrating an example of how a circuit testing system, according to an embodiment of the invention, may be used to measure a gate-to-gate timing/delay.

During the characterization step, only the devices of interest are exposed to the laser light. FIGS. 7A and 7B illustrate an example of how principles of the invention may be used to measure a gate-to-gate timing/delay. Before the laser is applied to a first gate (1 in FIG. 7A), the switching time of a second gate (2 in FIG. 7A) is t1 (FIG. 7B). That is, when an electrical pulse (e.g., logic 0 to logic 1 transition or logic 1 to logic 0 transition) is applied to the first gate, the gate will switch during the logic 1 to logic 0 transition or the logic 0 to logic 1 transition. The switching time corresponds to the optical emission. When gate 1 is exposed to a laser, either synchronously or non-synchronously, the switching time of the second gate can move to t2 (FIG. 7B). That is, the switching time of gate 2 is delayed by application of the laser energy. It is to be understood that in the synchronous mode, the laser can be turned on by the same electrical pulse applied to the first gate. Further, this above example is a simple example of optical emissions being captured from the circuit logic cone fed by a stimulated circuit. In other situations, the laser can cause an anticipation of the transitions of the second gate, i.e., t2<t1.

Variations in signal amplitude, slope and shape could also be caused by alteration of the gate behavior due to the laser, i.e., due to laser duration and/or laser power.

All these effects could be used to verify the characteristics of a FET or some other process variations and manufacturing marginalities. For instance, the threshold value of a transistor can be modified with a laser. If the process variation of the transistor is out of specification, a laser can change it and PICA can verify this change.

Thermal dependent fails could be also characterized by using a thermal laser in combination with this technique. For instance, a laser can generate local heat on the transistor and change the thermal characteristics of the transistor. A transistor will slow down when the temperature is higher.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of testing an integrated circuit, comprising the steps of:

stimulating at least a portion of the integrated circuit with a light source so as to affect one or more electrical characteristics associated with the integrated circuit;

capturing optical emissions from at least one of the portion of the integrated circuit stimulated by the light source and one or more portions of the integrated circuit associated with the stimulated portion, the optical emissions being associated with one or more switching operations of one or more components of the integrated circuit, wherein the portion of the integrated circuit stimulated by the light source and the one or more portions of the integrated circuit associated with the stimulated portion comprise functional portions of the integrated circuit that are being tested; and processing at least a portion of the captured optical emissions to provide information about the integrated circuit.

2. The method of claim 1, wherein the stimulating step is at least partially synchronized with the processing step.

3. The method of claim 1, wherein the stimulating step is not at least partially synchronized with the processing step.

4. The method of claim 1, wherein the stimulating step further comprises stimulating a component of the integrated circuit with the light source so as to affect one or more electrical characteristics associated with the component.

5. The method of claim 1, wherein the stimulating step further comprises causing a change to one or more electrical characteristics associated with a component of the integrated circuit.

6. The method of claim 1, wherein the stimulating step further comprises electro-optically causing a change to one or more electrical characteristics associated with a component of the integrated circuit.

7. The method of claim 1, wherein the stimulating step further comprises electro-thermally causing a change to one or more electrical characteristics associated with a component of the integrated circuit.

8. The method of claim 1, wherein the stimulating step further comprises changing a wavelength associated with the light source so as to change an effect on the one or more electrical characteristics associated with the integrated circuit.

9. The method of claim 1, wherein the stimulating step further comprises changing an amplitude associated with the light source so as to change an effect on the one or more electrical characteristics associated with the integrated circuit.

10. The method of claim 1, wherein the stimulating step further comprises changing a duration associated with the light source so as to change an effect on the one or more electrical characteristics associated with the integrated circuit.

11. Apparatus for testing an integrated circuit, comprising:
a light source operative to stimulate at least a portion of the integrated circuit so as to affect one or more electrical characteristics associated with the integrated circuit; and a circuit testing system operative to: (i) capture optical emissions from at least one of the portion of the integrated circuit stimulated by the light source and one or more portions of the integrated circuit associated with the stimulated portion, the optical emissions being associated with one or more switching operations of one or more components of the integrated circuit, wherein the portion of the integrated circuit stimulated by the light source and the one or more portions of the integrated circuit associated with the stimulated portion comprise functional portions of the integrated circuit that are being tested; and (ii) process at least a portion of the captured optical emissions to provide information about the integrated circuit.

12. The apparatus of claim 11, wherein the stimulating operation is at least partially synchronized with the processing operation.

13. The apparatus of claim 11, wherein the stimulating operation is not at least partially synchronized with the processing operation.

14. The apparatus of claim 11, wherein the stimulating operation further comprises stimulating a component of the integrated circuit with the light source so as to affect one or more electrical characteristics associated with the component.

15. The apparatus of claim 11, wherein the stimulating operation further comprises causing a change to one or more electrical characteristics associated with a component of the integrated circuit.

16. The apparatus of claim 11, wherein the stimulating operation further comprises electro-optically causing a change to one or more electrical characteristics associated with a component of the integrated circuit.

17. The apparatus of claim 11, wherein the stimulating operation further comprises electro-thermally causing a change to one or more electrical characteristics associated with a component of the integrated circuit.

18. The apparatus of claim 11, wherein the stimulating operation further comprises changing a wavelength associated with the light source so as to change an effect on the one or more electrical characteristics associated with the integrated circuit.

19. The apparatus of claim 11, wherein the stimulating operation further comprises changing an amplitude associated with the light source so as to change an effect on the one or more electrical characteristics associated with the integrated circuit.

20. The apparatus of claim 11, wherein the stimulating operation further comprises changing a duration associated with the light source so as to change an effect on the one or more electrical characteristics associated with the integrated circuit.

* * * * *